United States Patent
Liao et al.

(10) Patent No.: US 8,541,268 B2
(45) Date of Patent: Sep. 24, 2013

(54) METHOD FOR MANUFACTURING THIN FILM TRANSISTOR

(75) Inventors: Chan-Chang Liao, New Taipei (TW);
Hsien-Kun Chiu, Taoyuan (TW);
Wei-Pang Yen, Taoyuan County (TW);
Chao-Huan Hsu, Taoyuan County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 33 days.

(21) Appl. No.: 13/315,430

(22) Filed: Dec. 9, 2011

(65) Prior Publication Data

US 2013/0015445 A1    Jan. 17, 2013

(30) Foreign Application Priority Data

Jul. 13, 2011    (TW) .............................. 100124801 A

(51) Int. Cl.
*H01L 21/00* (2006.01)
*H01L 21/84* (2006.01)

(52) U.S. Cl.
USPC ........................................... 438/158; 257/59

(58) Field of Classification Search
USPC ....... 438/158; 257/59, 72, E33.053, E21.412
See application file for complete search history.

(56) References Cited

U.S. PATENT DOCUMENTS

| 6,741,621 | B2 | 5/2004 | Asano | |
| 7,344,928 | B2 | 3/2008 | Wong et al. | |
| 7,615,783 | B2 * | 11/2009 | Choi et al. | 257/59 |
| 7,645,648 | B2 * | 1/2010 | Kobayashi et al. | 438/149 |
| 7,816,159 | B2 * | 10/2010 | Fang et al. | 438/30 |
| 2009/0302318 | A1 * | 12/2009 | Chang | 257/59 |

FOREIGN PATENT DOCUMENTS

| TW | 579604 | 3/2004 |
| TW | I249249 | 2/2006 |

OTHER PUBLICATIONS

English Translation of abstract of TW 579604, issued Mar. 11, 2004.
English translation of abstract of TW I249249, issued Feb. 11, 2006.

* cited by examiner

*Primary Examiner* — Phuc Dang
(74) *Attorney, Agent, or Firm* — CKC & Partners Co., Ltd.

(57) ABSTRACT

A thin film transistor and a method for manufacturing the same are provided. A top-gate thin film transistor is fabricated by a process using two gray-tone photomasks and a lift-off method. Therefore, the method can save cost of photomasks and processes comparing to a conventional fabrication method.

9 Claims, 4 Drawing Sheets

METHOD FOR MANUFACTURING THIN FILM TRANSISTOR

RELATED APPLICATIONS

This application claims priority to Taiwan Application Serial Number 100124801, filed Jul. 13, 2011, which is herein incorporated by reference.

BACKGROUND

1. Field of Invention

The present invention relates to a thin film transistor and a method for manufacturing the same. More particularly, the present invention relates to a thin film transistor for liquid crystal display devices and a method for manufacturing the same.

2. Description of Related Art

A liquid crystal display device primarily includes components of a thin film transistor, a color filter and liquid crystal layer etc. The thin film transistor (TFT) primarily includes a gate electrode, a gate dielectric layer, a source electrode, and a drain electrode. According to the position of the gate electrode, the TFT can be classified as top-gate type or bottom-gate type. Furthermore, a transparent pixel electrode may be connected to the drain electrode. The thin film transistor is used to control the switch of the pixel electrode.

However, a method for manufacturing a thin film transistor, including a pixel electrode, typically needs four or more photomasks. Generally, the more photomasks are used, the more the cost is and the longer the process time needed.

SUMMARY

The following presents a summary of the disclosure in order to provide a basic understanding to the reader. This summary is not an extensive overview of the disclosure and it does not identify key/critical elements of the present invention or delineate the scope of the present invention. Its sole purpose is to present some concepts disclosed herein in a simplified form as a prelude to the more detailed description that is presented later.

An aspect of this invention provides a method for manufacturing a thin film transistor by using two gray-tone photomask processes and a lift-off method. Therefore, the method can save cost of photomasks and processes comparing to a conventional fabrication method.

Another aspect of this invention provides a method for manufacturing a thin film transistor including the following steps. A transparent conductive layer, a channel layer, an ohmic contact layer, and a first conductive layer are sequentially formed on a substrate. A first photoresist layer on the first conductive layer is formed by a first gray-tone photomask to expose the first conductive layer. The first photoresist layer has a first region, a second region and a third region. The third region has a thickness greater than the second region. The second region has a thickness greater than the first region. The exposed first conductive layer, and the channel layer, the ohmic contact layer and the transparent conductive layer thereunder are removed. The first photoresist layer in the first region is then removed. The exposed first conductive layer, and the ohmic contact layer and the channel layer thereunder are removed to expose the transparent conductive layer as a pixel electrode. The first photoresist layer in the second region is then removed. The exposed first conductive layer and the ohmic contact layer thereunder are removed to expose the channel layer. The first conductive layer disposed on opposite sides of the channel layer is acted as a source electrode and a drain electrode. The first photoresist layer in the third region is then removed. An insulating layer is formed on the source electrode, the drain electrode, the channel layer, and the transparent conductive layer. A second photoresist layer on the insulating layer is patterned by a second gray-tone photomask to expose a part of the insulating layer. The second photoresist layer has a fourth region and a fifth region. The fourth region is disposed on the exposed channel layer. The fourth region has a thickness less than the fifth region. The exposed part of the insulating layer is removed to form a contact window to expose a part of the drain electrode and a part of the transparent conductive layer. The second photoresist layer in the fourth region is removed to expose the insulating layer disposed between the source electrode and the drain electrode. A second conductive layer is formed on the second photoresist layer, the insulating layer, and the contact window. The second photoresist layer and the second conductive layer thereon are removed to leave a part of the second conductive layer to be a bridging conductive layer for electrically connecting the drain electrode and the pixel electrode, and another part of the second conductive layer to be a gate electrode disposing on the insulating layer between the source electrode and the drain electrode.

According to one embodiment of the present invention, the first photoresist layer is a positive photoresist.

According to one embodiment of the present invention, the second photoresist layer is a positive photoresist.

According to one embodiment of the present invention, the step of removing the second photoresist layer and the second conductive layer thereon comprises using a lift-off method.

According to one embodiment of the present invention, the lift-off method comprises using a solution to dissolve the second photoresist layer and simultaneously removing the second conductive layer thereon.

According to one embodiment of the present invention, the second photoresist layer has a thickness of 1.5-2.0 µm.

According to one embodiment of the present invention, the insulating layer is a silicon oxide layer or a silicon nitride layer.

According to one embodiment of the present invention, the channel layer is made of an undoped semiconductor material.

According to one embodiment of the present invention, the ohmic contact layer is made of a doped semiconductor material.

The present invention provides a thin film transistor. The thin film transistor includes a substrate, a transparent conductive layer, a channel layer, a source electrode, a drain electrode, an insulating layer, a gate electrode and a bridging conductive layer. The transparent conductive layer is disposed on the substrate to be a pixel electrode. The channel layer is disposed on a part of the transparent conductive layer. The source electrode is disposed on one side of the channel layer. The drain electrode is disposed on the other side of the channel layer. The insulating layer is disposed on the source electrode, the drain electrode, the channel layer and the pixel electrode. The insulating layer has a contact window. The gate electrode is disposed on the insulating layer between the source electrode and the drain electrode. The bridging conductive layer is disposed in the contact window to electrically connect the drain electrode and the pixel electrode.

It is to be understood that both the foregoing general description and the following detailed description are by examples, and are intended to provide further explanation of the invention as claimed.

BRIEF DESCRIPTION OF THE DRAWINGS

The invention may be more fully understood by reading the following detailed description of the embodiment, with reference made to the accompanying drawings as follows.

DETAILED DESCRIPTION

Figure 1A:
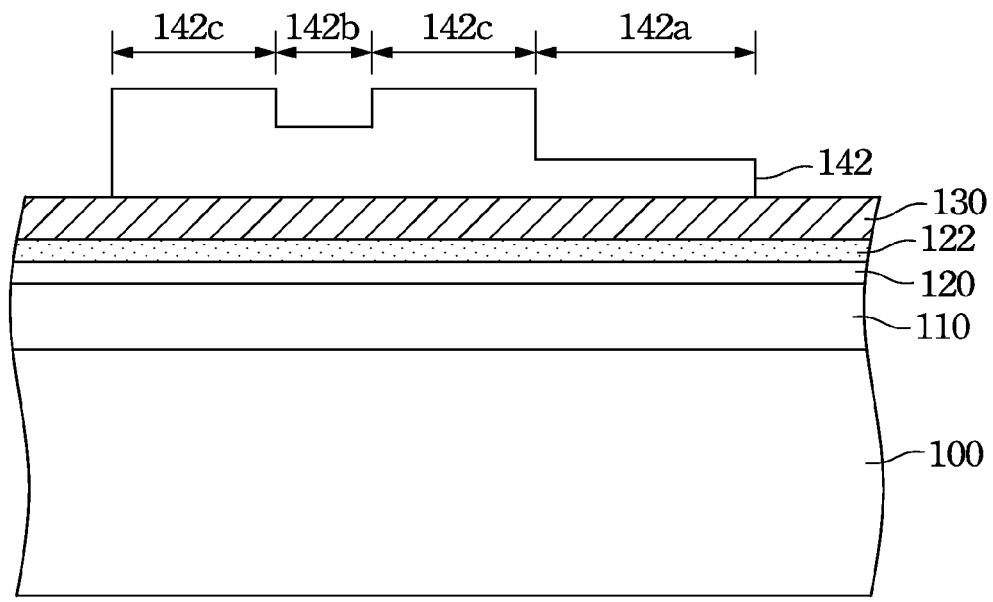
FIG. 1A to FIG. 1H are cross-sectional diagrams of a method for manufacturing a thin film transistor according to one embodiment of this invention.

Reference will now be made in detail to the present embodiments of the invention, examples of which are illustrated in the accompanying drawings.

Wherever possible, the same reference numbers are used in the drawings and the description to refer to the same or like parts.

Fabrication Method of Thin Film Transistor

FIG. 1A to FIG. 1H are cross-sectional diagrams of a method for manufacturing a thin film transistor according to one embodiment of this invention. FIG. 1A to FIG. 1D are cross-sectional diagrams of the process using a first gray-tone photomask. FIG. 1E to FIG. 1H are cross-sectional diagrams of the process using a second gray-tone photomask and lift-off method.

As shown in FIG. 1A, a transparent conductive layer 110, a channel layer 120, an ohmic contact layer 122, and a first conductive layer 130 are sequentially formed on a substrate 100. Next, a first photoresist layer 142 on the first conductive layer 130 is formed by using the first gray-tone photomask to expose the first conductive layer. The first photoresist layer 142 has a first region 142a, a second region 142b and a third region 142c. The transparent conductive layer 110 may be made of any transparent conductive materials, such as indium tin oxide. The channel layer 120 may be made of an undoped semiconductor material, such as amorphous silicon. The ohmic contact layer 122 may be made of a doped semiconductor material, such as doped amorphous silicon.

The first photoresist layer 142 has three different thicknesses respectively in a first region 142a, a second region 142b, and a third region 142c, from thick to thin. Since different positions of the first gray-tone photomask have different light transmittance, the photoresist layer can have different thicknesses after a photolithographic process. The first photoresist layer 142 can be a positive photoresist. As an example, a region of the first gray-tone photomask corresponding to the third region 142c may be opaque. Other regions of the first gray-tone photomask corresponding to the first region 142a and the second region 142b may be semitransparent, and the region corresponding to the first region 142a has a transmittance higher than the transmittance of the region corresponding to the second region 142b.

Figure 1B:
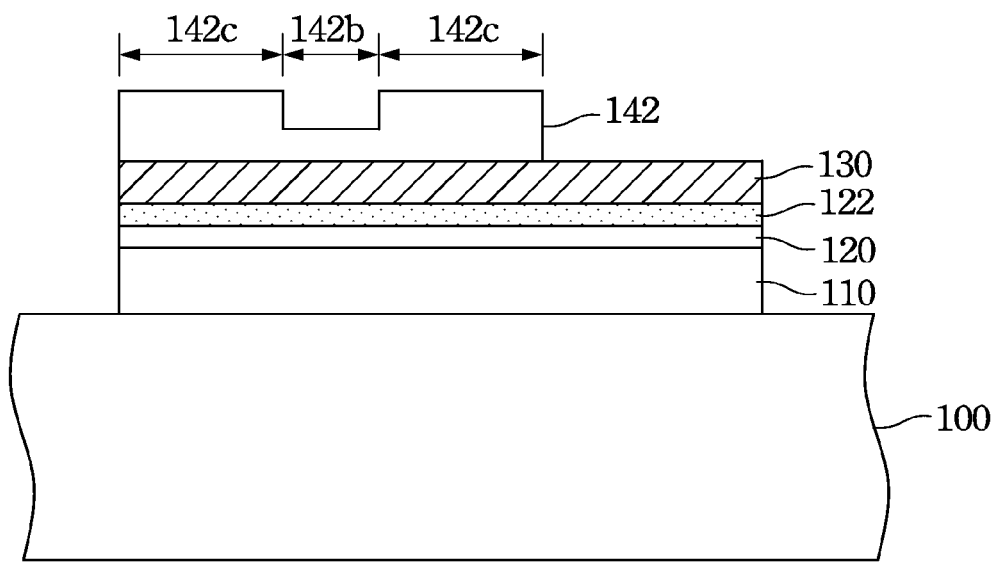

As shown in FIG. 1B, the exposed first conductive layer 130, and the channel layer 120, the ohmic contact layer 122, and the transparent conductive layer 110 thereunder are removed, according to the profile of the first photoresist layer 142, to define a pixel area (not shown). Next, the first photoresist layer 142 in the first region 142a is removed. The first conductive layer 130 and the transparent conductive layer 110 may be removed by wet etching. The ohmic contact layer 122 and the channel layer 120 may be removed by dry etching. The first photoresist layer 142 in the first region 142a may be removed by oxygen plasma etching to remove a certain thickness of the photoresist layer. Therefore, the photoresist layer in the first region 142a may be completely removed to expose the surface to be etched.

Figure 1C:
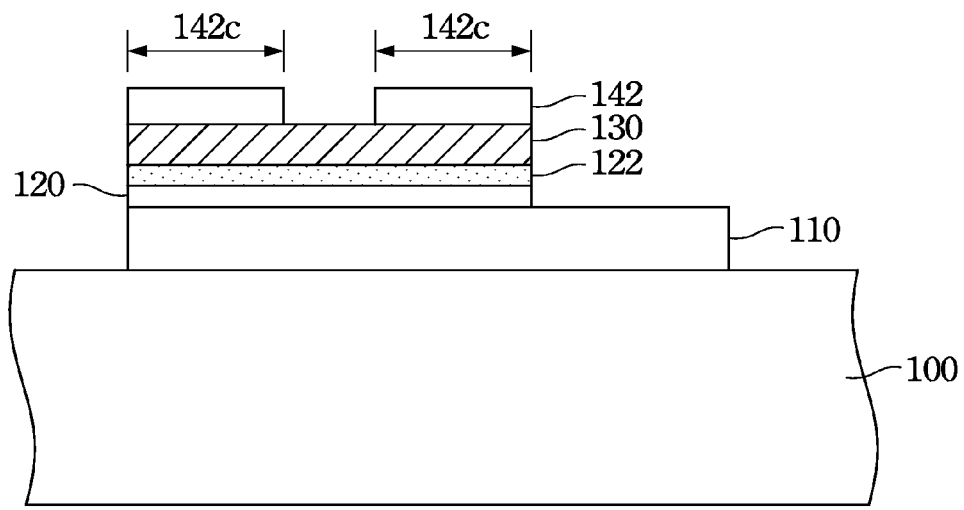

As shown in FIG. 1C, according to the remaining first photoresist layer 142 in the second region 142b and the third region 142c, the exposed first conductive layer 130, and the ohmic contact layer 122, and the channel layer 120 thereunder are removed to expose the transparent conductive layer 110 as a pixel electrode. Next, the first photoresist layer 142 in the second region 142b is removed to expose the first conductive layer 130. The first conductive layer 130 and the photoresist layer 142 in the second region 142b may be removed by the methods mentioned above, and thus omitted here.

Figure 1D:
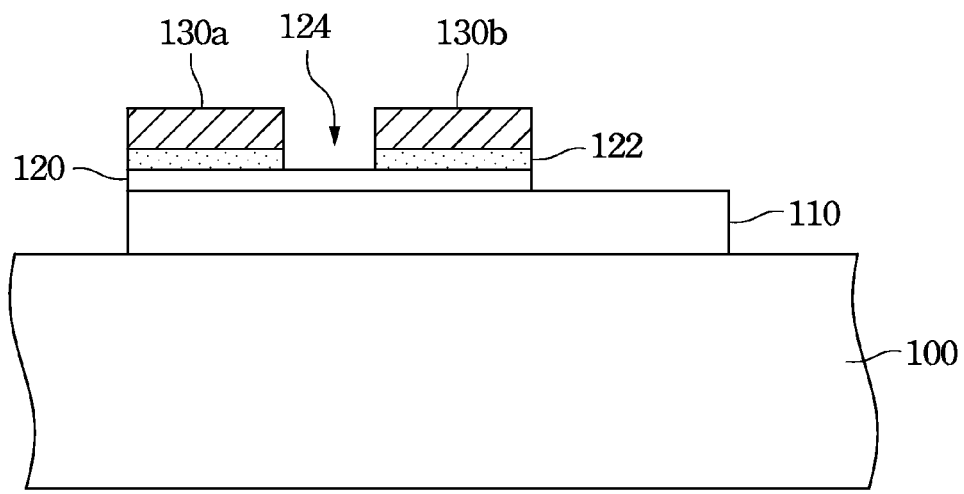

As shown in FIG. 1D, according to the first photoresist layer 142 in the third region 142c, the exposed first conductive layer 130 and the ohmic contact layer 122 thereunder are removed to form an opening 124 to expose the channel layer 120. The remaining first conductive layer 130 is used as a source electrode 130a and a drain electrode 130b. Subsequently, the first photoresist layer 142 in the third region 142c is removed.

Therefore, the first photoresist layer 142 in the second region 142b corresponds to the position of the opening 124. The third regions 142c correspond to the positions of the source electrode 130a and the drain electrode 130b.

Figure 1E:
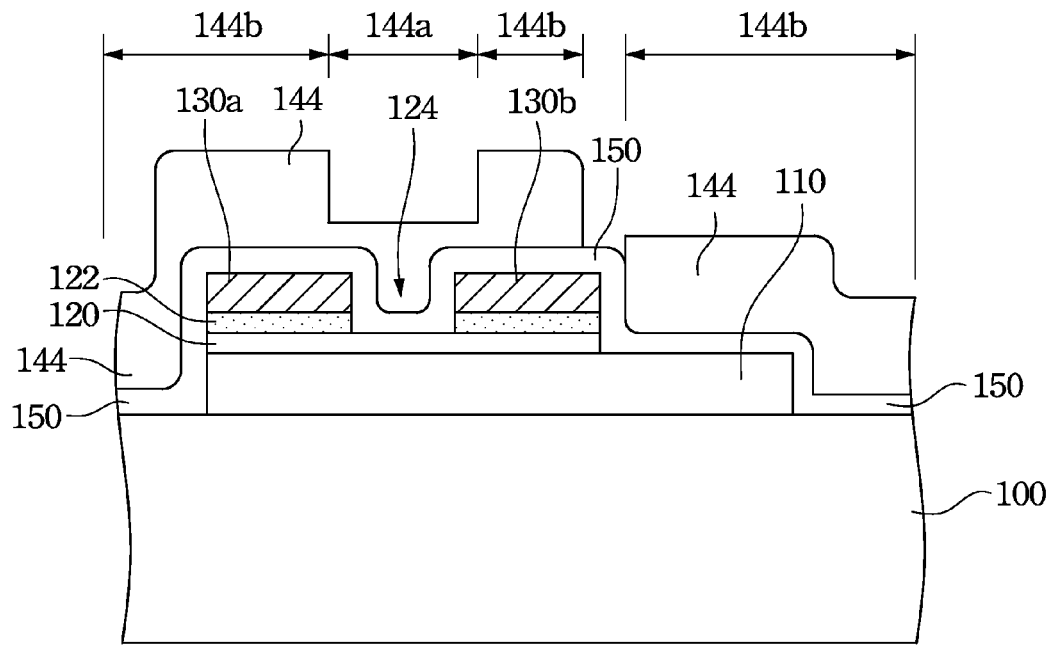

As shown in FIG. 1E, an insulating layer 150 is formed on the source electrode 130a, the drain electrode 130b, the channel layer 120, and the transparent conductive layer 110. Next, a second photoresist layer 144 is formed by using a second gray-tone photomask to expose a part of the insulating layer 150. The insulating layer 150 may be made of silicon oxide or silicon nitride. The second photoresist layer 144 has a fourth region 144a and a fifth region 144b. The second photoresist layer 144 has two different thicknesses respectively in the fourth region 144a and the fifth region 144b. The second photoresist layer 144 in the fourth region 144a has a thickness smaller than the thickness in the fifth region 144b. The second photoresist layer 144 in the fourth region 144a is disposed on the opening 124, i.e. on the insulating layer 150 between the source electrode 130a and the drain 130b, corresponding to the position of a gate electrode formed later. The second photoresist layer 144 may be a positive photoresist. For example, regions of the second gray-tone photomask corresponding to the fourth region 144a and the fifth region 144b may be semitransparent and opaque, respectively.

Figure 1F:
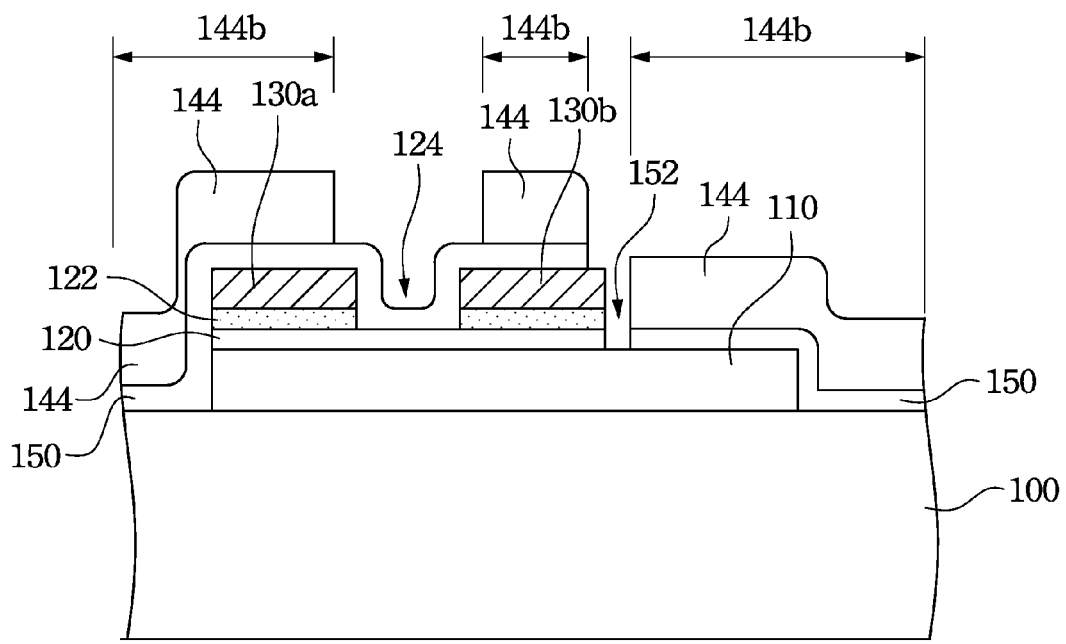

As shown in FIG. 1F, the exposed part of the insulating layer 150 is removed to form a contact window 152. The contact window 152 exposes a part of the drain electrode 130b and a part of the transparent conductive layer 110. Next, the second photoresist layer 144 is thinned to completely remove the photoresist in the fourth region 144a and to thin the photoresist in the fifth region 144b. The removal method of the insulating layer 150 may be dry etching.

Figure 1G:
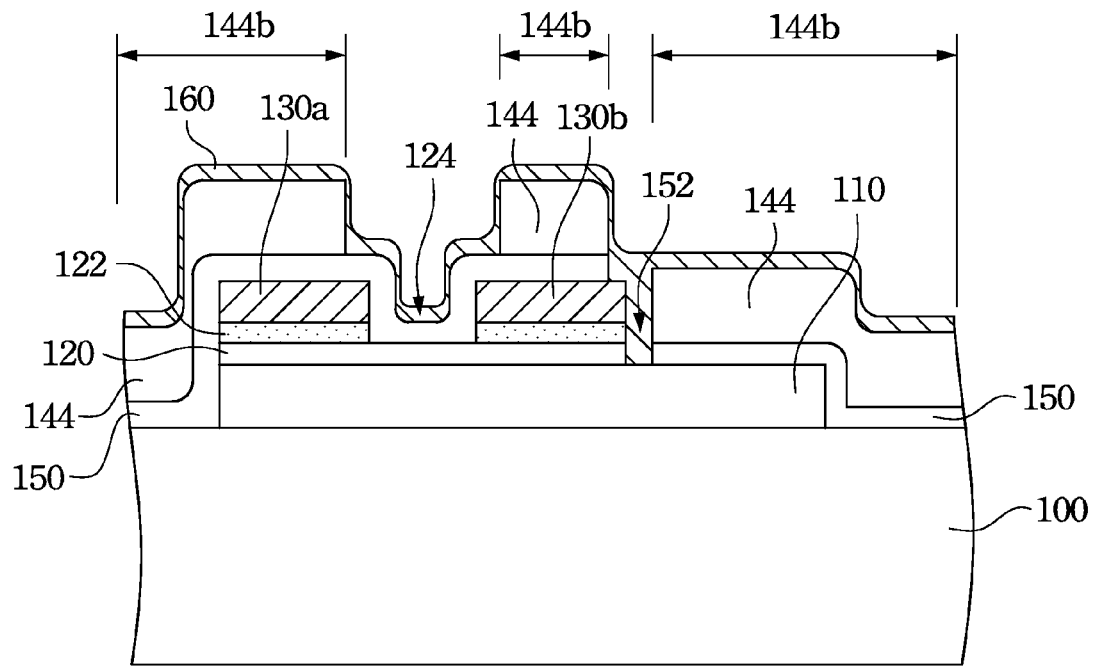

As shown in FIG. 1G, a second conductive layer 160 is formed on the remaining second photoresist layer 144, the exposed insulating layer 150, and the transparent conductive layer 110. The thickness of the second photoresist layer 144 may be 1.5-2.0 μm.

Figure 1H:
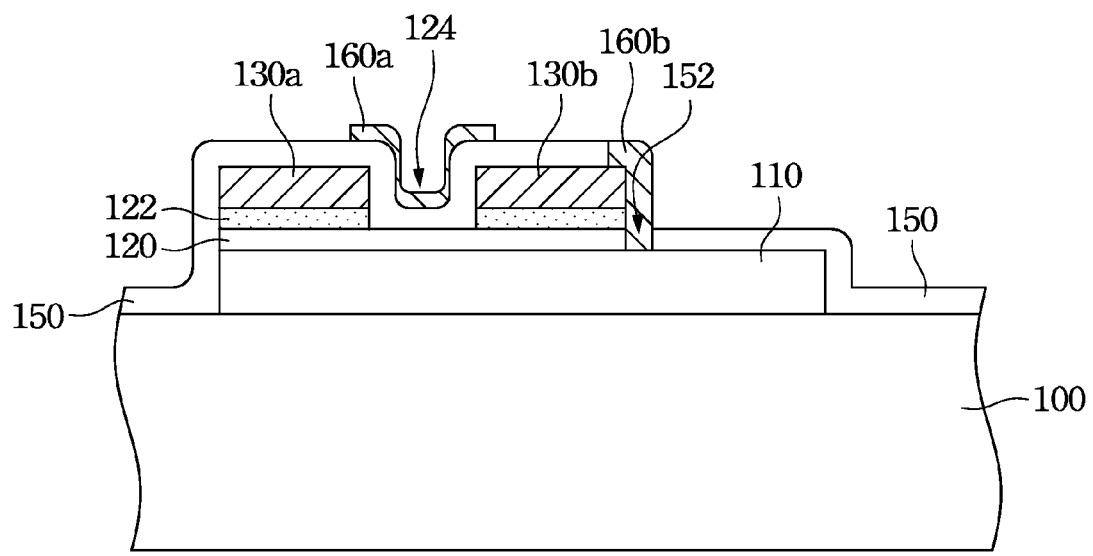

As shown in FIG. 1H, the second photoresist layer 144 and the second conductive layer 160 thereon are removed by a lift-off method to leave a part of the second conductive layer 144 to be a bridging conductive layer 160b in the contact window 152, and the other part of the second conductive layer 144 to be a gate electrode 160a on the opening 124.

The lift-off method is using a solution to dissolve the second photoresist layer 144 and then strip the second conductive layer 160 disposed thereon. The left parts of the second conductive layer 160 are used as the gate electrode 160a and the bridging conductive layer 160b. Since the thickness of the second conductive layer 160 on the sidewall of the second photoresist layer 144 is thinner, some parts of the second photoresist layer 144 may be exposed. Therefore, the exposed parts of the second photoresist layer 144 may be attacked by and then dissolved in the solution. The bridging conductive layer 160b is used to electrically connect the drain electrode 130b and the pixel electrode (i.e. the transparent conductive layer 110). The solution described above may be any solution able to dissolve the photoresist, such as inorganic or organic base solution.

Structure of Thin Film Transistor

FIG. 1H is a cross-sectional diagram of a thin film transistor according to one embodiment of this invention. The thin film transistor of the top gate type includes the substrate 100, the transparent conductive layer 110, the channel layer 120, the ohmic contact layer 122, the source electrode 130a, the drain electrode 130b, the insulating layer 150, the gate electrode 160a, and the bridging conductive layer 160b.

The transparent conductive layer 110 as the pixel electrode may be disposed on the substrate 100. The substrate 100 may be made of glass or quartz. The transparent conductive layer 110 may be made of any transparent conductive materials, such as indium tin oxide.

The channel layer 120 and the ohmic contact layer 122 are sequentially disposed on the transparent conductive layer 110. Next, the source electrode 130a and the drain electrode 130b are disposed on the ohmic contact layer 122. The material of the channel layer 120 and the ohmic contact layer 122 can be undoped and doped semiconductor materials, such as undoped and doped amorphous silicon, respectively. The source electrode 130a and the drain electrode 130b may be made of aluminum, copper or other suitable conductive materials.

The insulating layer 150 having the contact window 152 is disposed on the source electrode 130a, the drain electrode 130b, the ohmic contact layer 122, and the transparent conductive layer 110. The insulating layer 150 may be made of silicon oxide or silicon nitride. The contact window 152 is used to expose a part of the drain electrode 130b and a part of the transparent conductive layer 110.

The gate electrode 160a is disposed on the insulating layer 150 in the opening 124. The gate electrode 160a may be made of aluminum, copper, or other suitable conductive materials.

The bridging conductive layer 160b is disposed in the contact window 152 to electrically connect the drain electrode 130b and the pixel electrode (i.e. the transparent conductive layer 110). The gate electrode 160a and the bridging conductive layer 160b may be made of the same materials.

As described above, the method for manufacturing the thin film transistor by using two gray-tone photomask processes and a lift-off method is provided. The pixel electrode, the opening, the source electrode and the drain electrode are formed on a substrate by using the first gray-tone photomask process. Next, the gate electrode and the bridging conductive layer are formed simultaneously on the substrate by using the second gray-tone photomask process and the lift-off method. Therefore, comparing to conventional fabrication method, the method can save the costs of the photomasks and the processes.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations may be made to the structure of the present invention without departing from the scope or spirit of the invention. In view of the foregoing, it is intended that the present invention cover modifications and variations of this invention provided they fall within the scope of the following claims.

What is claimed is:

1. A method for manufacturing a thin film transistor, comprising:

sequentially forming a transparent conductive layer, a channel layer, an ohmic contact layer, a first conductive layer on a substrate;

forming a first photoresist layer on the first conductive layer by a first gray-tone photomask to expose the first conductive layer, wherein the first photoresist layer has a first region, a second region and a third region, the third region has a thickness greater than the second region, and the second region has a thickness greater than the first region:

removing the exposed first conductive layer, and the channel layer, the ohmic contact layer and the transparent conductive layer thereunder;

removing the first photoresist layer in the first region;

removing the exposed first conductive layer, and the ohmic contact layer and the channel layer thereunder to expose the transparent conductive layer as a pixel electrode;

removing the first photoresist layer in the second region;

removing the exposed first conductive layer and the ohmic contact layer thereunder to expose the channel layer, wherein the first conductive layer disposed on opposite sides of the channel layer is acted as a source electrode and a drain electrode;

removing the first photoresist layer in the third region;

sequentially forming an insulating layer on the source electrode, the drain electrode, the channel layer, and the transparent conductive layer;

forming a second photoresist layer on the insulating layer by a second gray-tone photomask to expose a part of the insulating layer, wherein the second photoresist layer has a fourth region disposed on the channel layer and a fifth region, and the fourth region has a thickness less than the fifth region;

removing the exposed part of the insulating layer to form a contact window to expose a part of the drain electrode and a part of the transparent conductive layer;

removing the second photoresist layer in the fourth region expose the insulating layer disposed between the source electrode and the drain electrode;

forming a second conductive layer on the second photoresist layer, the insulating layer, and the contact window; and removing the second photoresist layer and the second conductive layer thereon to leave a part of the second conductive layer to be a bridging conductive layer for electrically connecting the drain electrode and the pixel electrode, and another part of the second conductive layer to be a gate electrode disposing on the insulating layer between the source electrode and the drain electrode.

2. The method of claim 1, wherein the first photoresist layer is a positive photoresist.

3. The method of claim 1, wherein the second photoresist layer is a positive photoresist.

4. The method of claim 1, wherein the step of removing the second photoresist layer and the second conductive layer thereon comprises using a lift-off method.

5. The method of claim 4, wherein the lift-off method comprises using a solution to dissolve the second photoresist layer and simultaneously removing the second conductive layer thereon.

6. The method of claim 1, wherein the second photoresist layer has a thickness of 1.5-2.0 µm.

7. The method of claim 1, wherein the insulating layer is a silicon oxide layer or a silicon nitride layer.

8. The method of claim 1, wherein the channel layer is made of an undoped semiconductor material.

9. The method of claim 1, wherein the ohmic contact layer is made of a doped semiconductor material.

* * * * *